(12) United States Patent
Matsuda et al.

(10) Patent No.: US 9,083,303 B2
(45) Date of Patent: Jul. 14, 2015

(54) ACOUSTIC WAVE DEVICE

(75) Inventors: Satoru Matsuda, Tokyo (JP); Michio Miura, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 334 days.

(21) Appl. No.: 13/593,356

(22) Filed: Aug. 23, 2012

(65) Prior Publication Data

US 2012/0313483 A1 Dec. 13, 2012

Related U.S. Application Data

(63) Continuation of application No. PCT/JP2011/053630, filed on Feb. 21, 2011.

(30) Foreign Application Priority Data

Feb. 26, 2010 (JP) ................................. 2010-042663

(51) Int. Cl.
*H01L 41/04* (2006.01)
*H03H 9/02* (2006.01)
*H03H 9/64* (2006.01)

(52) U.S. Cl.
CPC ......... *H03H 9/02866* (2013.01); *H03H 9/6483* (2013.01)

(58) Field of Classification Search
CPC . H03H 9/02866; H03H 9/6483; H03H 9/173; H03H 9/0576; H03H 9/0028; H03H 9/1454; H03H 9/587; H03H 9/14579

USPC ...... 310/313 A, 313 B, 313 R, 313 C, 313 D; 333/133–135, 195–196
IPC .......................................... H01L 41/04, 41/047
See application file for complete search history.

(56) References Cited

U.S. PATENT DOCUMENTS 6,940,208 B2 * 9/2005 Kando ...................... 310/313 R
7,132,779 B2 * 11/2006 Kando ...................... 310/313 R
(Continued)

FOREIGN PATENT DOCUMENTS

JP 2003-198317 A 7/2003
JP 2005-318017 A 11/2005
(Continued)

OTHER PUBLICATIONS

Written Opinion (PCT/ISA/237) issued in PCT/JP2011/053630 mailed in Mar. 2011.
International Search Report (ISR) issued in PCT/JP2011/053630 mailed in Mar. 2011.
Japanese Office Action dated Jul. 9, 2013 in a counterpart Japanese patent application No. 2010-042663.

*Primary Examiner* — Thomas Dougherty
*Assistant Examiner* — Karen B Addison
(74) *Attorney, Agent, or Firm* — Chen Yoshimura LLP

(57) ABSTRACT

An acoustic wave device includes a substrate, a dielectric film formed on the substrate and a pair of IDT electrodes opposing each other provided between the substrate and the dielectric film. At least one of the substrate and the dielectric film is piezoelectric. The IDT electrodes each include an electrode finger that extends in at least one direction. A film thickness of the dielectric film changes in a gap portion between a tip of the electrode finger of one of the IDT electrodes and the other opposing IDT electrode in the direction of extension of the electrode finger.

7 Claims, 12 Drawing Sheets

(56) References Cited

U.S. PATENT DOCUMENTS

| | | | |
|---|---|---|---|
| 8,896,399 B2 * | 11/2014 | Miura et al. | 310/313 D |
| 2003/0117240 A1 | 6/2003 | Inoue et al. | |
| 2009/0206954 A1 | 8/2009 | Hashimoto et al. | |
| 2010/0219905 A1 | 9/2010 | Nakamura et al. | |

FOREIGN PATENT DOCUMENTS

| | | |
|---|---|---|
| JP | 2007-110342 A | 4/2007 |
| JP | 2009-290472 A | 12/2009 |
| WO | 2006/078001 A1 | 7/2006 |
| WO | 2008/078573 A1 | 7/2008 |

* cited by examiner

ACOUSTIC WAVE DEVICE

CROSS-REFERENCE TO RELATED APPLICATION

This application is a continuation of International Application No. PCT/JP2011/053630, filed on Feb. 21, 2011 and is based upon and claims the benefit of priority of the prior Japanese Patent Application No. 2010-042663, filed on Feb. 26, 2010, the entire contents of which are incorporated herein by reference.

FIELD

A technology disclosed in this application relates to acoustic wave devices to be used in, for example, electric circuits in Communication device or the like.

BACKGROUND

Acoustic wave devices are used as, for example, filters of wireless equipment or the like. It is required for the acoustic wave devices to reduce the absolute value of the temperature coefficient of frequency (TCF) of the pass bands of filters, the resonant frequencies of resonators or the like. It is known for surface acoustic wave devices that the absolute value of the TCF can be reduced by forming a dielectric film such as a silicon oxide film that has a temperature coefficient opposite to that of a piezoelectric substrate made of $LiTaO_3$ (LT), $LiNbO_3$ (LN) or the like, on the piezoelectric substrate.

Furthermore, in acoustic wave devices employing IDT electrodes, various measures are attempted to be taken in order to reduce high-order transverse mode spurious responses. For example, weighting may be performed by causing the width over which electrode fingers of the IDT electrodes alternate to be partially different. In this case, dummy electrode fingers are provided in a portion where adjacent electrode fingers do not alternate. With acoustic wave devices in which weighting is applied to the electrode fingers of the IDT electrodes, the sound velocity of acoustic waves (elastic waves) becomes discontinuous in an area where the acoustic waves propagate. As a result, undesirable effects such as scattering of acoustic waves that have passed through a portion where the sound velocity is discontinuous, or unintended mode conversion to other waves will occur, which increases loss in the acoustic wave devices.

Patent Document 1 described below suggests a method for scattering acoustic waves of transverse modes by causing a dummy electrode and a dummy portion of a cross electrode adjacent to the dummy electrode to have different lengths, thereby suppressing spurious responses.

Patent Document 1: International Publication Pamphlet No. WO2006/078001

SUMMARY

An exemplary acoustic wave device disclosed in the present application includes a substrate, a dielectric film formed on the substrate, and IDT electrodes provided between the substrate and the dielectric film, wherein at least one of the substrate and the dielectric film is piezoelectric, the IDT electrodes each include an electrode finger that extends in at least one direction, and a film thickness of the dielectric film changes in a gap portion between a tip of the electrode finger of an IDT electrode and an opposing IDT electrode in the direction of extension of the electrode finger.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENTS

Hereinafter, exemplary embodiments will be described in detail with reference to the drawings.

Embodiment 1

Exemplary Configuration of Acoustic Wave Device

Figure 1A:
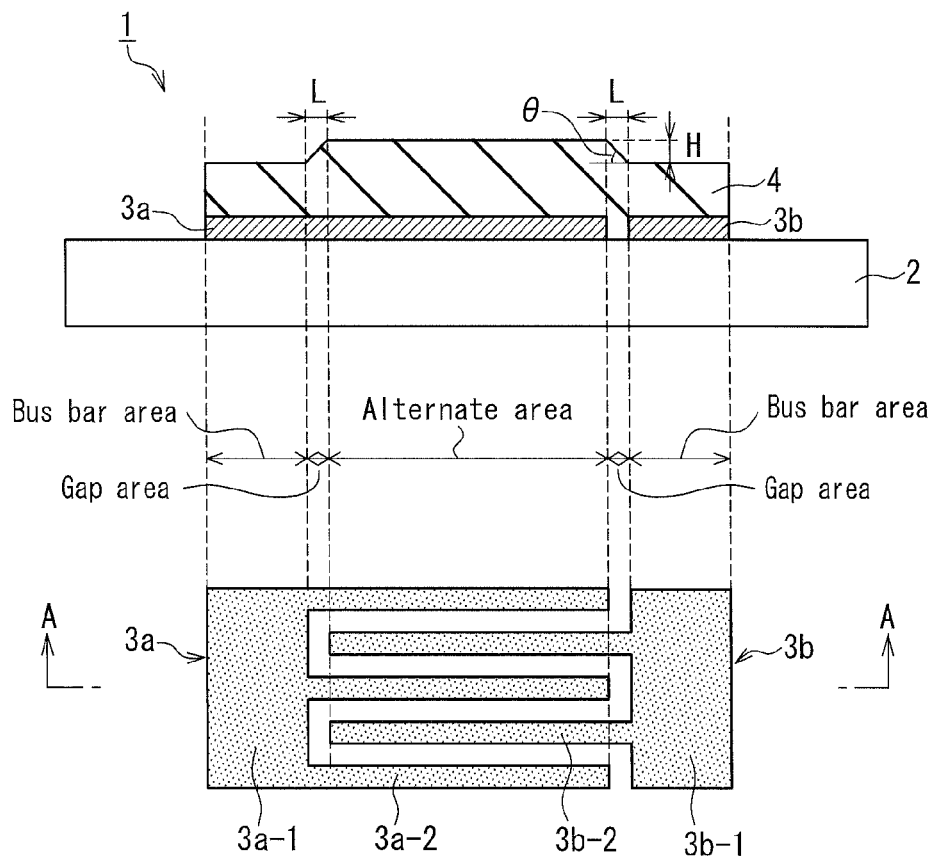
FIG. 1A illustrates an example of a configuration of an acoustic wave device according to Embodiment 1.

FIG. 1A shows a cross-sectional view of an acoustic wave device (upper section) and a partial plan view of IDT electrodes (lower section) according to Embodiment 1. The cross-sectional view shown in the upper section of FIG. 1A illustrates a cross section taken along line A-A in the plan view shown in the lower section. FIG. 1A is a plan view of the IDT electrodes of the acoustic wave device shown in FIG. 1B. FIG. 1C is a top view for depicting a sloped portion of a dielectric film of the acoustic wave device shown in FIG. 1A.

Figure 1B:
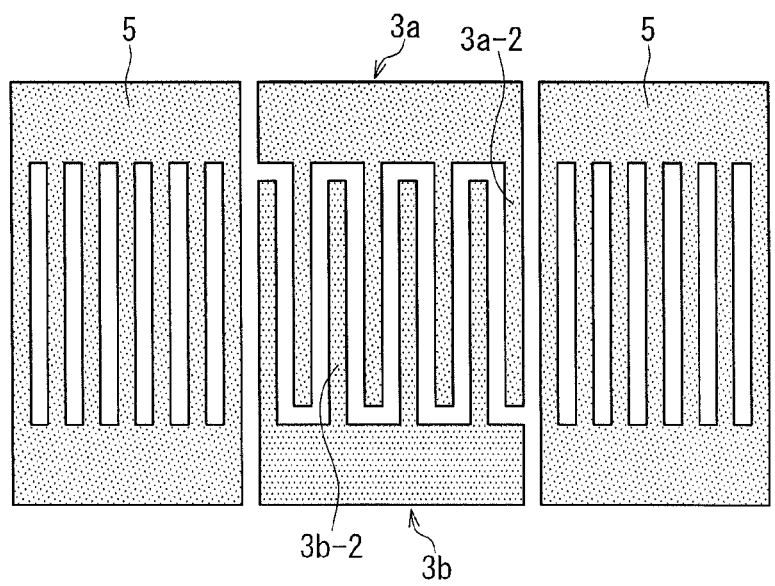
FIG. 1B illustrates an example of a configuration of IDT electrodes of the acoustic wave device according to Embodiment 1.
Figure 1C:
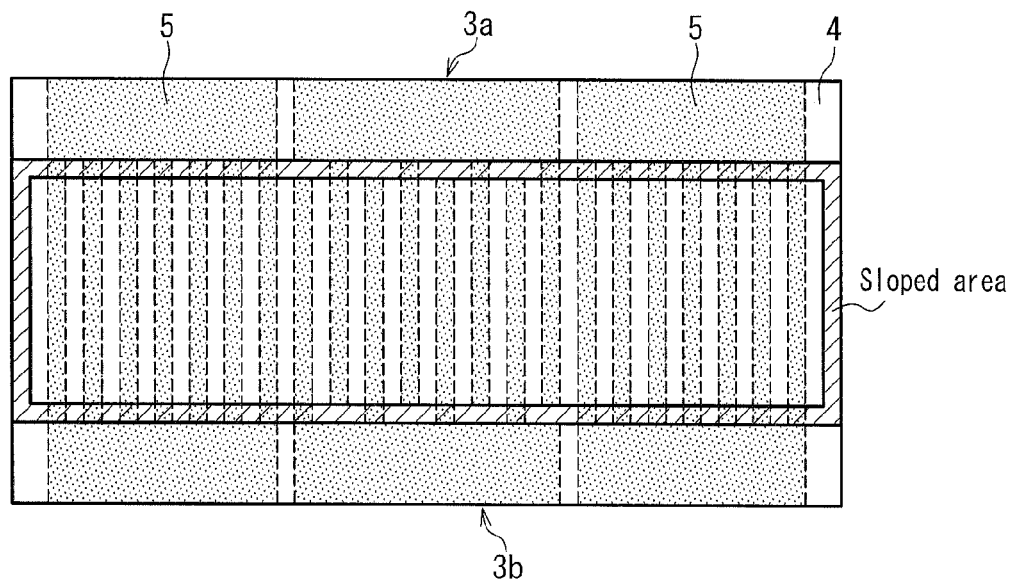
FIG. 1C illustrates an example of a configuration of a dielectric film of the acoustic wave device according to Embodiment 1.

In the acoustic wave device 1 shown in FIGS. 1A to 1C, a pair of IDT electrodes 3a and 3b opposing each other are provided on a piezoelectric substrate 2, and reflectors 5 are provided on both sides of the IDT electrodes 3a and 3b. On the substrate 2 is also provided a dielectric film 4 covering the IDT electrodes 3a and 3b and the reflectors 5. The dielectric film 4 has a greater film thickness than that of the IDT electrodes 3a and 3b. The principal material of the substrate 2 may, for example, be $LiNbO_3$. The principal material of the IDT electrodes 3a and 3b may, for example, be Cu. The principal material of the dielectric film 4 may, for example, be $SiO_2$.

Upon application of a voltage that changes with time between the IDT electrodes 3a and 3b, acoustic waves are excited. When the excited acoustic waves propagate while being reflected between the pair of reflectors 5, resonant waves are produced at a specific frequency. As a result, the acoustic wave device 1 can operate as a resonator.

The IDT electrode 3a includes a bus bar 3a-1 and electrode fingers 3a-2 connected to the bus bar 3a-1, and the IDT electrode 3b includes a bus bar 3b-1 and electrode fingers 3b-2 connected to the bus bar 3b-1. The electrode fingers can also be called "straps", each having a narrow elongated shape extending in one direction. Hereinafter, the direction in which the electrode fingers extend is referred to as an "electrode finger direction". The bus bars 3a-1 and 3b-1 are connected to a plurality of electrode fingers arranged in parallel at equal intervals. The electrode fingers 3a-1 of one IDT electrode 3a and the electrode fingers 3b-1 of the other IDT electrode 3b are disposed such that they are arranged alternately and in parallel. Acoustic waves will propagate in a direction perpendicular to the electrode finger direction of the electrode fingers 3a-2 and 3b-2. In the propagation direction of acoustic waves, the electrode fingers are disposed such that at least one electrode finger 3a-2 and one electrode finger 3b-2 are included in one-wave ($\lambda$) section. In the electrode finger direction of the IDT electrodes 3a and 3b, there are included bus bar areas where the bus bars 3a-1 and 3b-1 are provided, an alternate area in which adjacent electrode fingers are alternately aligned (i.e. overlapped) in the propagation direction of acoustic waves, and gap areas where no electrodes exist. Among these areas, the alternate area contributes to the excitation of acoustic waves. The IDT (interdigital transducer) electrodes may also be referred to as "interdigital electrodes" or "comb-like electrodes".

A portion ranging from the tips (i.e. the leading edge) of the electrode fingers 3a-2 to the opposite IDT electrode (in the example shown in FIG. 1, the bus bar 3b-1) in the electrode finger direction forms a gap portion where no electrodes exist. That is, the gap portion is a portion where no electrodes exist in the electrode finger direction. The film thickness of the dielectric film 4 changes in this gap portion. In the present embodiment, the film thickness of the dielectric film 4 continuously varies in gap portions G ranging from the tips of the electrode fingers to the IDT electrode that is opposing to the tips in the electrode finger direction. That is, the dielectric film 4 has a face that slopes to the substrate 2 in the gap portions G. The film thickness of the dielectric film 4 on the electrode fingers 3a-2 and 3b-2 of the IDT electrodes is different from that of the dielectric film 4 on the bus bars 3a-1 and 3b-1. In the present embodiment, the dielectric film 4 has a greater film thickness in the area of the electrode fingers of the IDT electrodes than in the bus bar areas. Changing the film thickness of the dielectric film 4 in the gap portions makes it possible to reduce transverse mode spurious responses as will be described later. Moreover, since the bus bars and a dummy portion are also covered with the dielectric film 4, degradation in reliability owing to exposure of the bus bars and the dummy portion being exposed will not occur.

FIG. 1C shows an example of disposition of the sloped portion of the dielectric film 4 when viewed from above. In FIG. 1C, the film thickness of the dielectric film 4 also changes in a portion (i.e. dummy portion) that is not the alternate area of the electrode fingers 3a-2 and 3b-2. That is, in the example shown in FIG. 1C, the dielectric film has a sloped area in an area that covers all of the gap portions of the IDT electrodes 3a and 3b and the dummy portion. In FIG. 1C, the sloped area is diagonally hatched. By providing the dielectric film 4 with a slope in the dummy portion of the electrode fingers as well as the gap portions in this way, it is possible to further reduce spurious responses.

As one example, the length of the electrode fingers 3a-2 and 3b-2 may be set to $30\lambda$, the length of the gap portions (gap length) may be set to $0.25\lambda$, and the film thickness of the dielectric film 4 may be set to $0.3\lambda$. The present embodiment includes 70 pairs of electrodes and 15 pairs of reflectors. By adjusting etching conditions when forming the dielectric film 4, part of the surface of the dielectric film 4 can be caused to slope to the substrate surface. The slope angle is, for example, 35 degrees. The film thickness of the dielectric film 4 in the bus bar areas may be set to $0.05\lambda$. In this case, the width of the sloped portion in the electrode finger direction (width of the base) is $0.35\lambda$, and the slope of the dielectric film 4 ranges from the electrode fingers to the bus bars so as to cover the entire gaps. This makes it possible to secure a large process margin as high as $0.1\lambda$ and is preferable in terms of process reproducibility.

In the example shown in FIGS. 1A to 1C, alternate width that is the length of a portion in which the electrode fingers 3a-2 of one IDT electrode 3a and their adjacent electrode fingers 3b-2 are alternately aligned (=alternate) in the propagation direction of acoustic waves is constant in the propagation direction of the acoustic waves. Such an electrode may be called a normal electrode. In normal electrodes, high-order modes (transverse modes) are likely to occur in the direction of the aperture length of IDT electrodes. As a technique for suppressing such occurrence, apodization weighting may be employed so as to perform weighting on the alternate width. However, in the present embodiment, since, as described above, the configuration is such that the film thickness of the dielectric film 4 changes in the gap portions, it is possible even for the normal electrodes to sufficiently suppress the occurrence of transverse modes. Note that in the above-described configuration, apodization weighting may be performed without making the alternate width constant. In this case, the occurrence of transverse modes can be further suppressed.

Measurement Results

Figure 2:
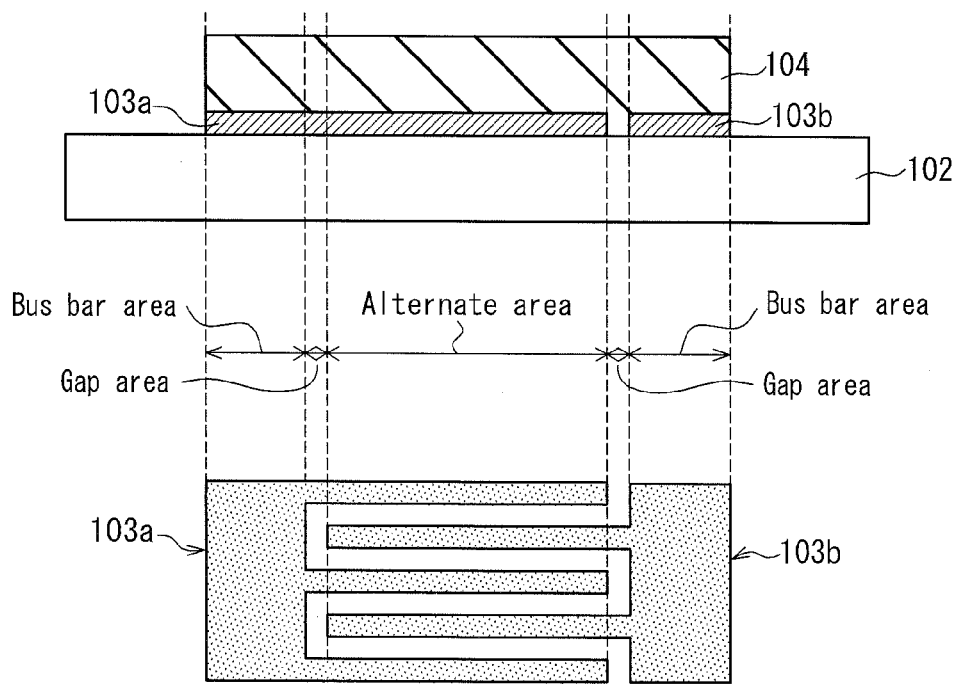
FIG. 2 illustrates an example of an acoustic wave device having a structure in which a dielectric film has no slope.

FIG. 2 shows an example of an acoustic wave device having a structure in which a dielectric film has no slope. In the acoustic wave device shown in FIG. 2, the structures of a substrate 102 and IDT electrodes 103a and 103b are similar to those shown in FIGS. 1A to 1C. A dielectric film 104 has no slope. That is, the overall film thickness of the dielectric film 104 is constant.

Figure 3:
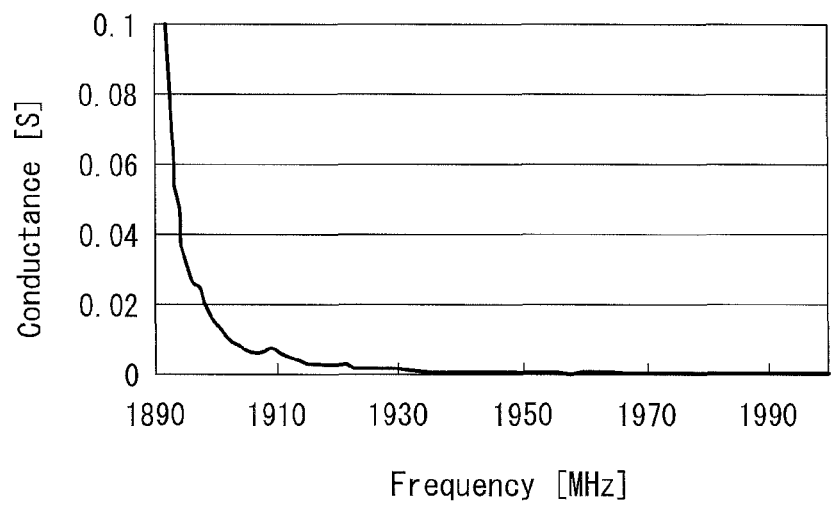
FIG. 3 is a graph showing an example of the result of measuring the conductance of the acoustic wave device shown in FIGS. 1A to 1C.

The following shows the results of measuring the conductance of the acoustic wave device 1 shown in FIGS. 1A to 1C and the conductance of the acoustic wave device shown in FIG. 2 at frequencies between the resonant and anti-resonant frequencies. FIG. 3 is a graph showing the result of measuring the conductance of the acoustic wave device shown in FIGS. 1A to 1C, and FIG. 4 is a graph showing the result of measuring the conductance of the acoustic wave device shown in FIG. 2. The results shown in FIGS. 3 and 4 indicate that in the case of the structure in which the dielectric film has a slope, transverse mode spurious responses are reduced as compared with the structure with no slope.

Figure 5:
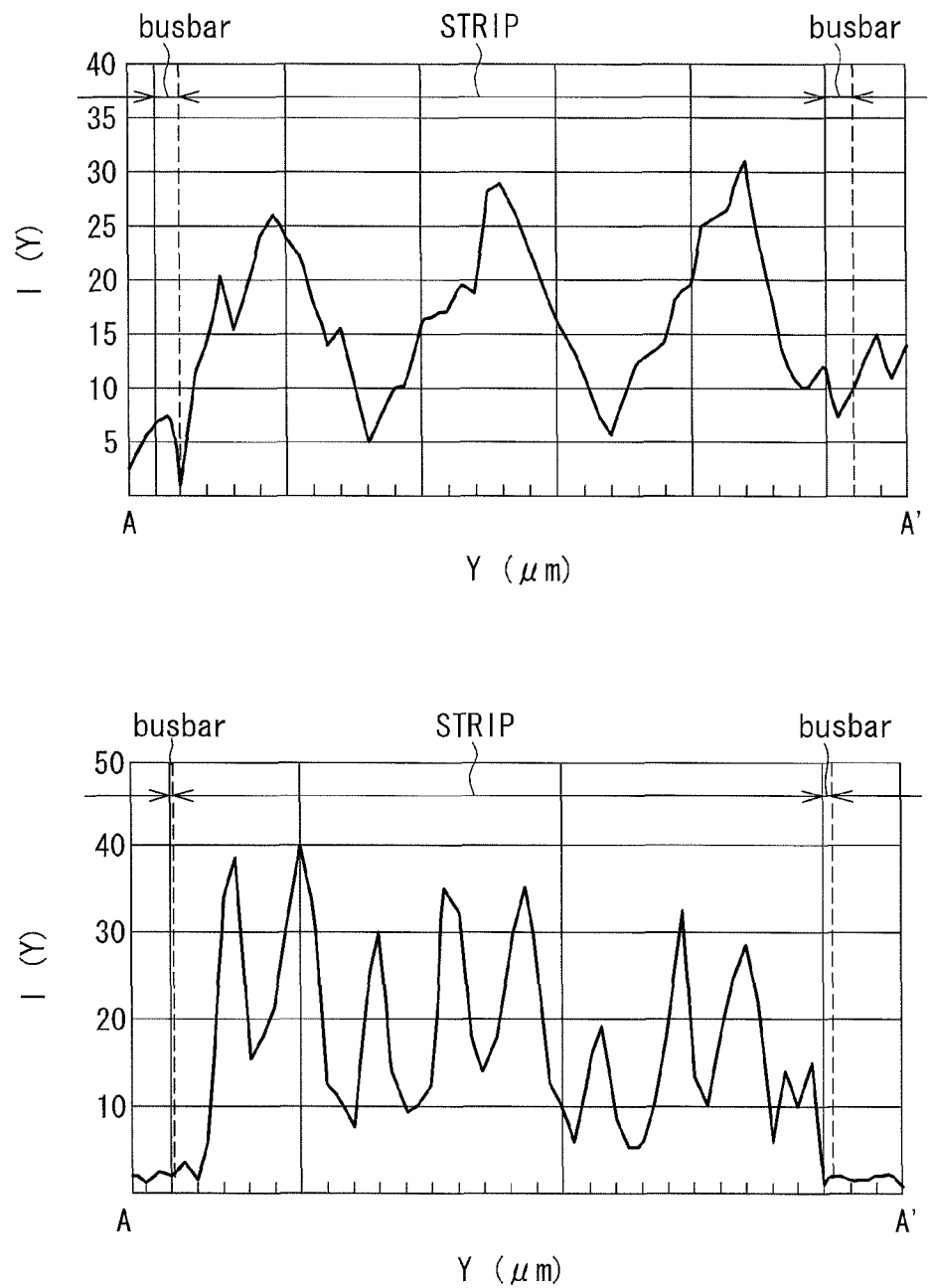
FIG. 5 illustrates graphs showing an example of the results of measuring the distribution of acoustic waves in a state in which the acoustic wave devices are driven.

FIG. 5 shows graphs showing the results of measuring the distributions of acoustic waves in the acoustic wave device in which the dielectric film has a slope (FIGS. 1A to 1C) and in the acoustic wave device with no slope (FIG. 2) in a state where these acoustic wave devices are driven. FIG. 5 shows the results obtained by measuring frequencies at which third-order modes serving as high-order transverse modes occur, as driving frequencies. The graphs in FIG. 5 show profiles of the distribution of acoustic waves in the cross section taken along line A-A. In FIG. 5, the vertical axes indicate the amount of displacement of acoustic waves, and the horizontal axes indicate the position of measurement on line A-A. The graph shown in the upper section shows the result of measurement for the acoustic wave device in which the dielectric film has no slope (acoustic wave device shown in FIG. 2), and the graph shown in the lower section shows the result of measurement for the acoustic wave device in which the dielectric film has a slope (acoustic wave device shown in FIGS. 1A to 1C).

It can be seen from the measurement results shown in FIG. 5 that high third-order transverse modes are excited in the structure in which the dielectric film has no slope. On the other hand, in the structure in which the dielectric film has a slope, a large number of other higher-order transverse modes are also excited in addition to high third-order transverse modes.

As conditions for causing transverse modes to occur, the sound velocity on reflecting surfaces of acoustic waves of transverse modes has a great influence. The inventors have thus searched for the reflecting surfaces of acoustic waves and examined the influence of the sound velocity on the reflecting surfaces. As a result, the inventors found that the reflecting surfaces of acoustic waves of transverse modes exist in the gap portions. The inventors also found that changing the film thickness of the dielectric film in the gap portions produces a difference in the sound velocity of acoustic waves that are reflected in the gap portions, the amount of the difference depending on the slope. Then, it becomes evident that if there is a difference in the sound velocity of acoustic waves on the reflecting surfaces, the frequency at which transverse modes occur varies depending on the sound velocity. As a result, it is found that the amount of transverse modes that occur increases. Based on the findings, it is found that transverse mode spurious responses can be reduced by changing the film thickness of the dielectric film in the gap portions.

It can be seen from the measurement results shown in FIG. 5 that the structure in which the dielectric film has a slope in the gap portions has a difference in the sound velocity of acoustic waves on the reflecting surfaces, and the frequency at which transverse modes are excited varies depending on the sound velocity. It is thus thought that spurious responses are reduced as a result of dispersing the velocities of the acoustic waves of the excited transverse modes.

Slope Angle and Film Thickness of Dielectric Film

Figure 6:
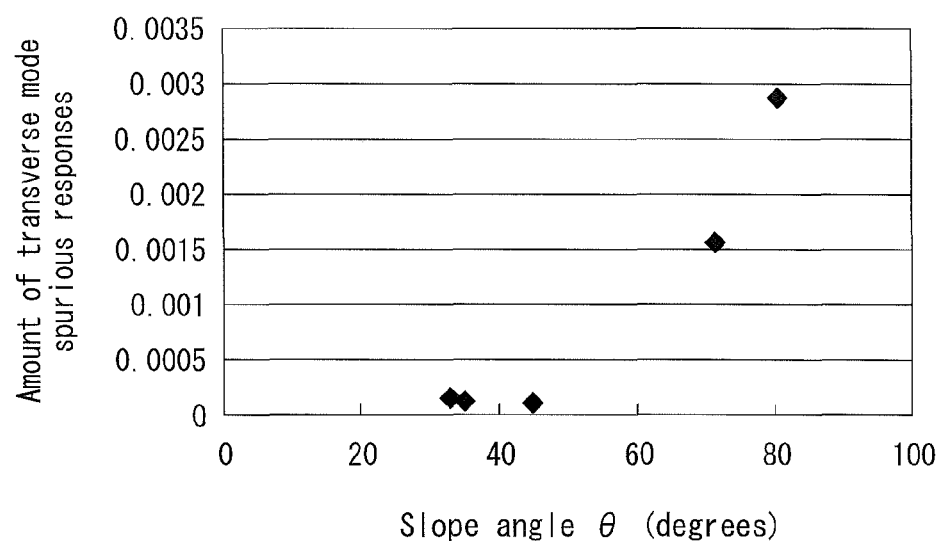
FIG. 6 is a graph showing an example of the result of measuring a change in the amount of transverse mode spurious responses when a slope angle is changed in the acoustic wave device.

The slope angle of the dielectric film can be changed by changing, for example, the film thickness of a resist or the etching conditions. In view of this, Inventors examines the magnitude of transverse mode spurious responses by changing the slope angle $\theta$ of the dielectric film with respect to a cross section along the electrode finger direction to 80 degrees, 70 degrees, 45 degrees, 35 degrees, and 33 degrees. FIG. 6 is a graph showing the result of measuring a change in the amount of transverse mode spurious responses when the slope angle $\theta$ of the dielectric film 4 with respect to the substrate 2 in the cross section taken along line A-A is changed in the acoustic wave device having the structure shown in FIG. 1A. It can be seen from the result shown in FIG. 6 that for the slope angles greater than 45 degrees, the magnitude of transverse mode spurious responses increases with increasing slope angle. It is also found that for the slope angles of 45 degrees or less, the amount of change in the magnitude of transverse mode spurious responses is smaller than for the slope angles greater than 45 degrees.

In the case where the slope angle is 45 degrees or less, a configuration is such that the slope of the dielectric film 4 covers the entire gap portions. It is thus conceivable that a difference is caused in the magnitude of transverse mode spurious responses, depending on whether or not the entire gap portions are covered with the slope of the dielectric film 4. That is, it can be thought that for the slope angles of 45 degrees or less, a sufficient difference in sound velocity can be obtained since the slope of the dielectric film covers the entire gap portions. On the other hand, for the slope angles greater than 45 degrees, only part of the gap portions is covered with the slope, and the amount of reduction of spurious responses is reduced because a difference in sound velocity decreases with increasing slope angle. For example, for the slope angle of 80 degrees, the length of the base of the slope is 0.025λ, and only one tenth of the gaps in length is covered with the slope. In this case, it is difficult to obtain a sufficient difference in sound velocity on the reflecting surfaces, which reduces the effect of reducing spurious responses.

If H is a film thickness difference caused by the slope of the dielectric film 4 having the slope angle $\theta$ and L is the gap length of the gap portions in the electrode finger direction, the entire gap portions are covered with the slope of the dielectric film 4 if the following formula (1) is satisfied.

$$\theta \leq \tan^{-1}(H/L) \tag{1}$$

For example, if the film thickness difference H of a dielectric is 0.3λ and the gap length L is 0.25λ, a configuration in which the entire gap portions are covered with the slope of the dielectric can be implemented if the slope angle $\theta$ satisfies the following formula (2).

$$\text{Slope Angle } \theta \leq \tan^{-1}(0.3/0.25) = 50.2 \tag{2}$$

In this way, employing a configuration in which a change in the film thickness of the dielectric film 4 starts outward of one end and ends outward of the other end of the gap portion G in the electrode finger direction makes it possible to further reduce spurious responses.

Moreover, a film thickness difference between the dielectric film 4 on the bus bar areas and the dielectric film 4 on the electrode fingers of the IDT electrodes can be made greater than the film thickness of the electrodes (film thickness of the IDT electrodes). For example, the slope angle θ may satisfy the following formula (3).

$$\tan^{-1}(\text{Electrode Film Thickness}/L) < \text{Slope Angle } \theta \quad (3)$$

Furthermore, spurious responses occurring at the resonant frequency or less can be reduced by covering the bus bars 3a-1 and 3b-1 with the dielectric film 4.

Figure 7:
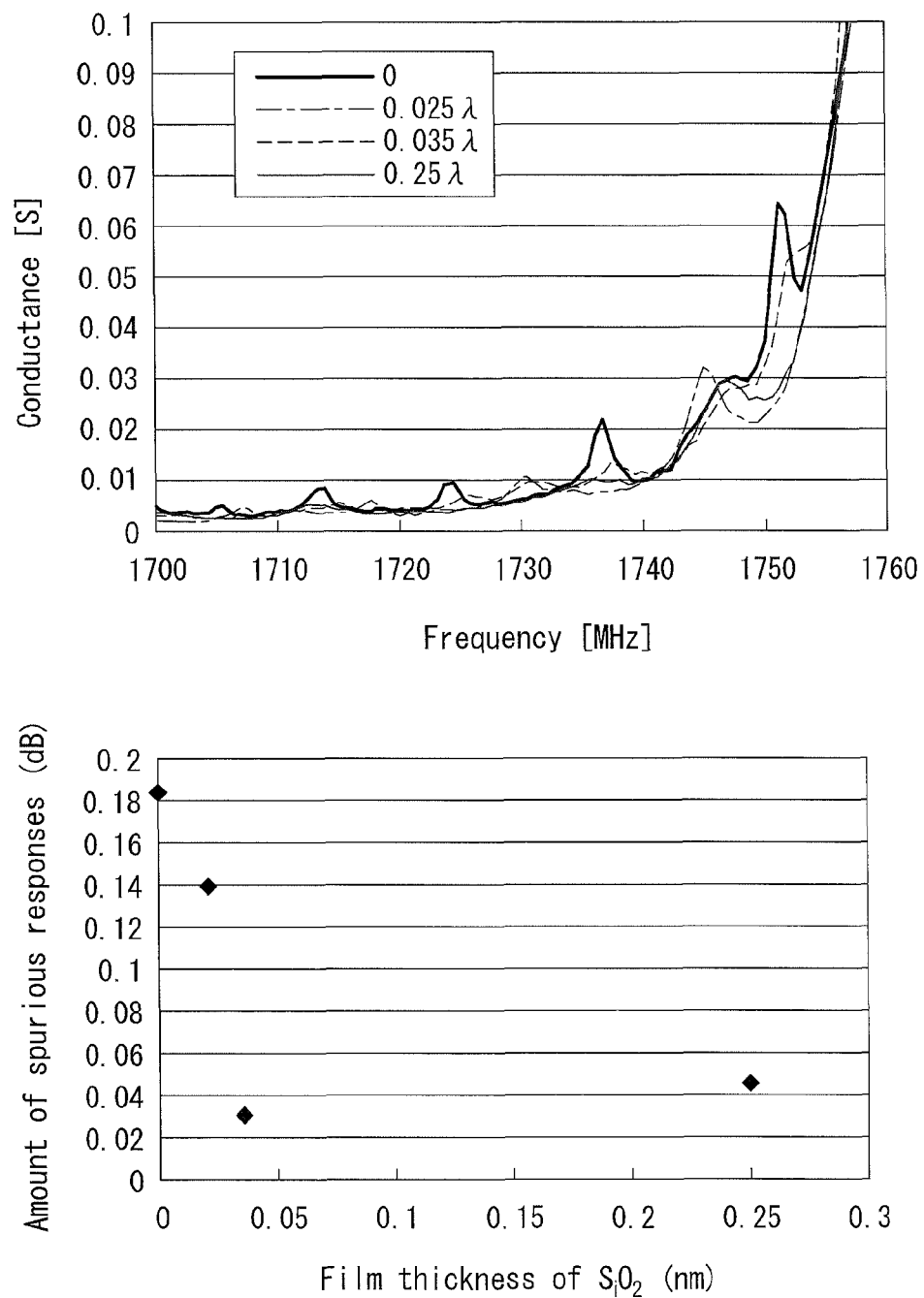
FIG. 7 illustrates graphs showing an example of the results of measuring the frequency characteristic of the acoustic wave device and the amount of spurious modes.

FIG. 7 illustrates graphs showing the results of measuring the conductance characteristic and the greatest magnitude of spurious responses at the resonant frequency or less when the film thickness of the dielectric film 4 on the bus bars 3a-1 and 3b-1 is changed to 0, 0.025λ, 0.035λ, and 0.25λ. In the graph shown in the upper section of FIG. 7, the vertical axis indicates the conductance characteristic of the acoustic wave device, and the horizontal axis indicates the frequency. In the graph shown in the lower section, the horizontal axis indicates the film thickness of the dielectric film 4, and the vertical axis indicates the magnitude of most intensely excited spurious responses.

It can be seen from the results shown in FIG. 7 that if the film thickness of the dielectric film 4 remaining on the bus bars 3a-1 and 3b-1 is a certain fixed value or more, the magnitude of spurious responses that occur is small. For example, if the film thickness of the dielectric film 4 remaining on the bus bars 3a-1 and 3b-1 is set to 0.05λ or more, it is possible to increase the amount of reduction of unwanted spurious responses occurring at the resonant frequency or less.

Consequently, it is preferable to use appropriate values for both the film thickness of the dielectric remaining on the bus bars 3a-1 and 3b-1 and the slope angle of the dielectric.

Exemplary Configuration of Filter

Figure 8:
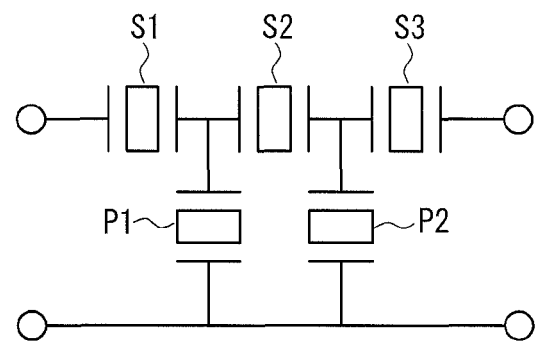
FIG. 8 is an exemplary circuit diagram of a ladder filter in which a plurality of resonators are disposed.
Figure 9:
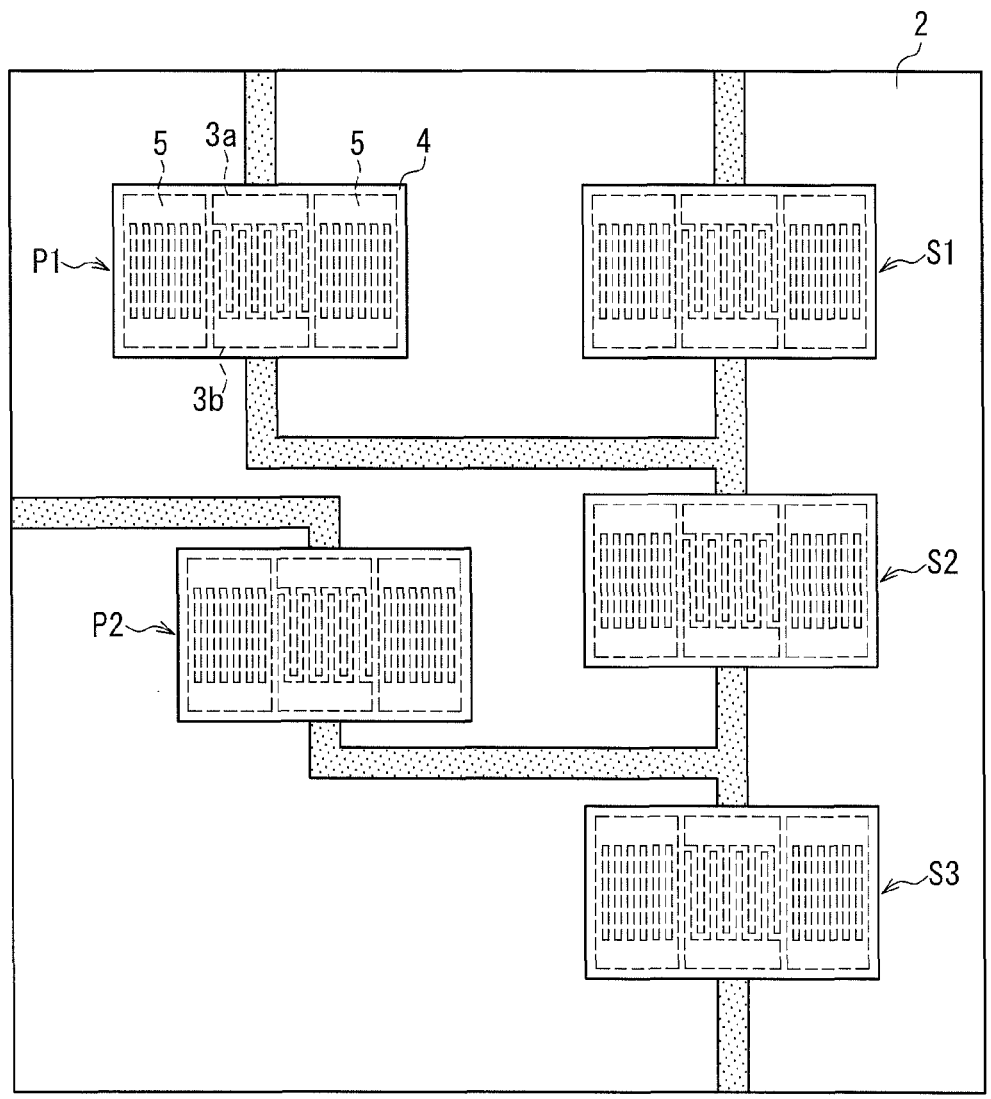
FIG. 9 is a plan view of an example of acoustic wave devices constituting the ladder filter shown in FIG. 8.

FIG. 8 is an exemplary circuit diagram of a ladder filter in which a plurality of resonators are disposed. FIG. 9 is a plan view of acoustic wave devices constituting the ladder filter shown in FIG. 8. The ladder filter shown in FIG. 8 includes serial resonators S1 to S3 connected to serial arms, and parallel resonators P1 and P2 connected to parallel arms. In the example shown in FIG. 9, the ladder filter is constituted by the serial resonators S1 to S3, the parallel resonators P1 and P2, and a wiring pattern for connecting these resonators, all of which are provided on a piezoelectric substrate 2. In each resonator, IDT electrodes 3a and 3b and reflectors 5 are provided on the piezoelectric substrate 2, and a dielectric film 4 is further provided so as to cover these electrodes and reflectors. The dielectric film 4 has a slope in gap portions. That is, each resonator has a configuration of the acoustic wave device shown in FIGS. 1A to 1C.

Figure 10:
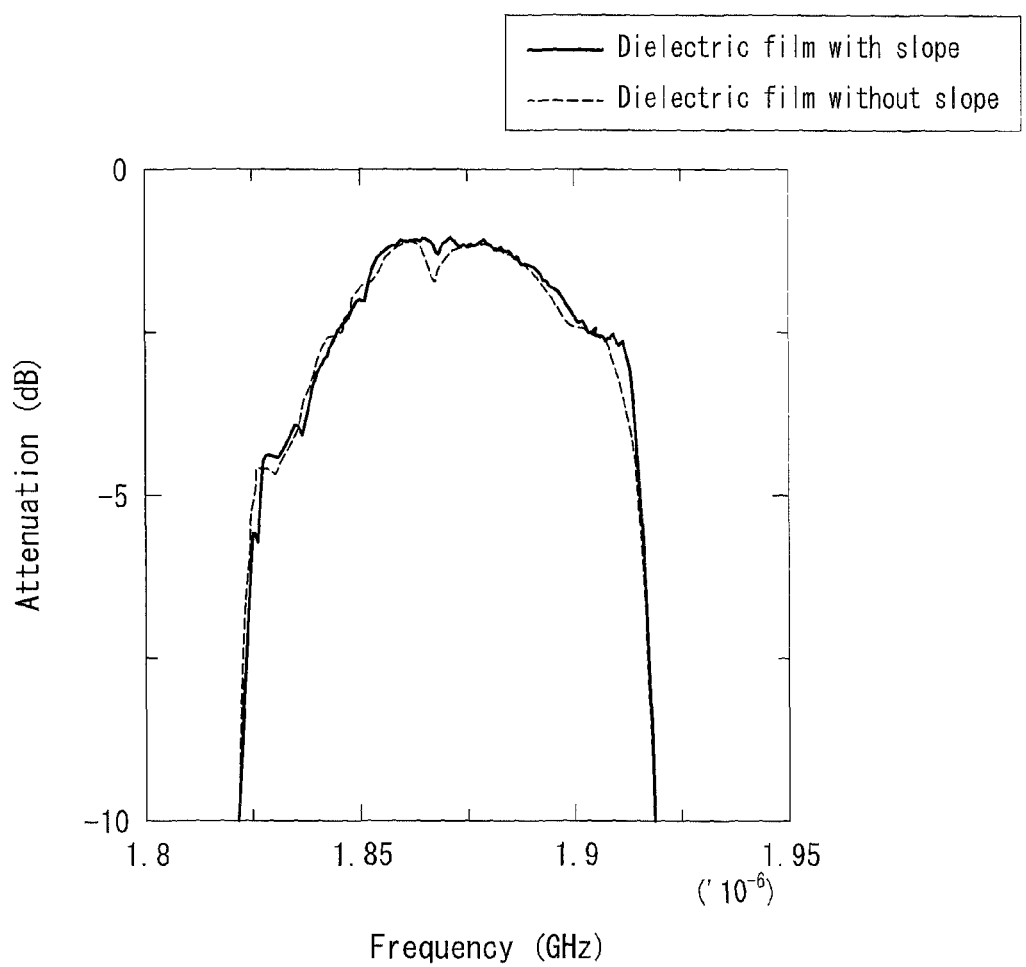
FIG. 10 is a graph showing an example of the result of measuring the frequency characteristic of the filter.

FIG. 10 is a graph showing the result of measuring a frequency characteristic (solid line) of the filter shown in FIG. 9 and a frequency characteristics (broken line) of a filter that uses acoustic wave devices in which dielectric films have no slope, for resonators. The result shown in FIG. 10 indicates that the amount of transverse mode spurious responses is smaller in the filter using the acoustic wave devices in which the dielectric films have a slope.

Variation 1

Figure 11:
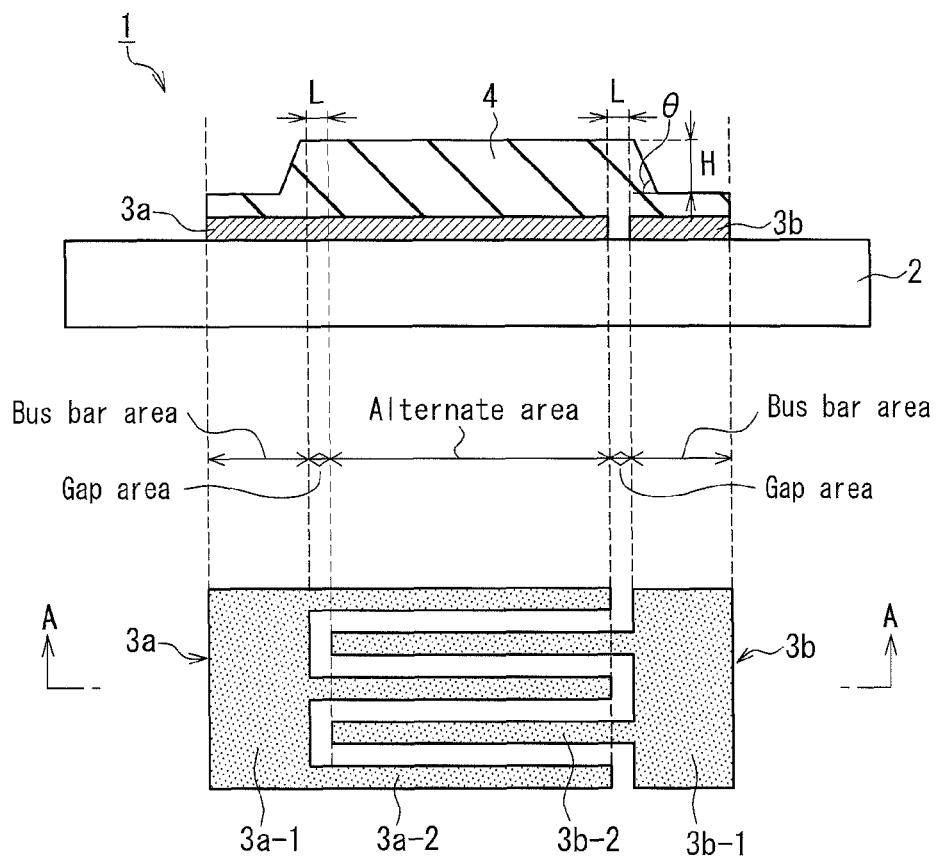
FIG. 11 illustrates an example of a cross-sectional view of an acoustic wave device and a partial plan view of IDT electrodes according to Variation 1.

FIG. 11 shows a cross-sectional view of an acoustic wave device and a partial plan view of IDT electrodes according to Variation 1. The cross-sectional view shown in the upper section of FIG. 11 shows a cross section taken along line A-A in the plan view shown in the lower section of FIG. 11. In the acoustic wave device shown in FIG. 11, the dielectric film 4 starts to slope from a position that is 0.5λ away from the gap portion toward the bus bar (outward). That is, the dielectric film 4 has a slope on the bus bars outside of the gap portions.

Figure 4:
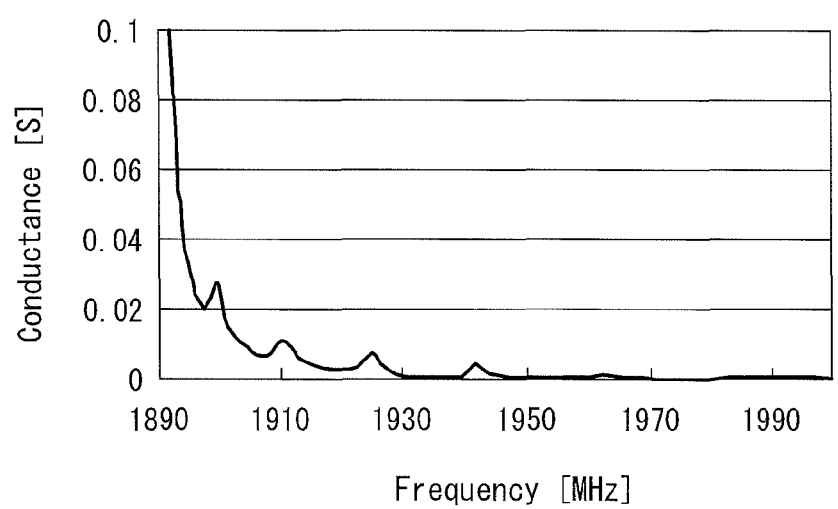
FIG. 4 is a graph showing an example of the result of measuring the conductance of the acoustic wave device shown in FIG. 2.
Figure 12:
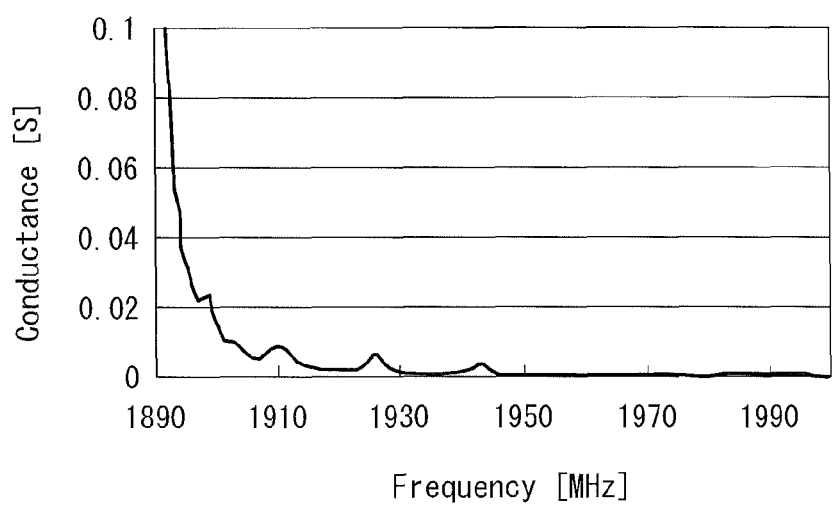
FIG. 12 is a graph showing an example of the result of measuring the conductance of the acoustic wave device shown in FIG. 11.

FIG. 12 is a graph showing the result of measuring the conductance of the acoustic wave device shown in FIG. 11. The result shown in FIG. 12 indicates that transverse mode spurious responses are reduced as compared with the case in which the dielectric film has no slope (FIG. 4). In this way, as a result of the configuration of the acoustic wave device in which the slope is formed by reducing part of the film thickness of the dielectric film, it is possible to reduce transverse mode spurious responses. However, it can be seen from the result in FIG. 12 that if the slope is formed on the bus bars, the amount of spurious responses that can be reduced becomes smaller than in the case where the slope is on the gap portions (FIG. 3). Since, in the example shown in FIG. 11, energy seeped out into the bus bars is caused to be dispersed by causing the sloped portion to disperse the frequency at which transverse modes occur, it is conceivable that the effect of reducing transverse mode spurious responses is lessened as compared with the configuration in which a slope exists on the gap portions serving as the reflecting surfaces. Based on this, it can be said that the effect of reducing spurious responses can be increased by forming the slope of the dielectric film 4 on the reflecting surfaces of acoustic waves, i.e., on the gap portions.

Variation 2

Figure 13:
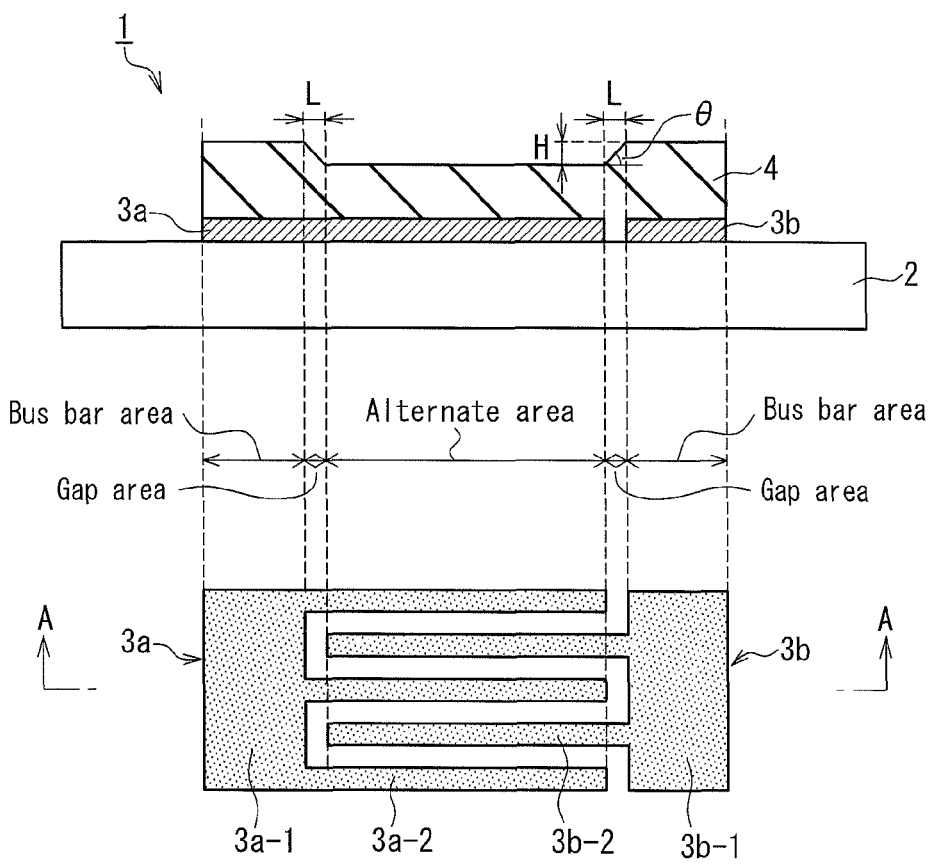
FIG. 13 illustrates an example of a cross-sectional view of an acoustic wave device and a partial plan view of IDT electrodes according to Variation 2.

FIG. 13 shows a cross-sectional view of an acoustic wave device and a partial plan view of IDT electrodes according to Variation 2. The cross-sectional view shown in the upper section of FIG. 13 shows a cross section taken along line A-A in the plan view shown in the lower section of FIG. 13. In the acoustic wave device shown in FIG. 13, the film thickness of the dielectric film 4 on the electrode fingers 3a-2 and 3b-2 is smaller than that of the dielectric film 4 on the bus bars 3a-1 and 3b-1. As a result, the dielectric film 4 can have a slope formed in the gap portions.

Variation 3

Figure 14A:
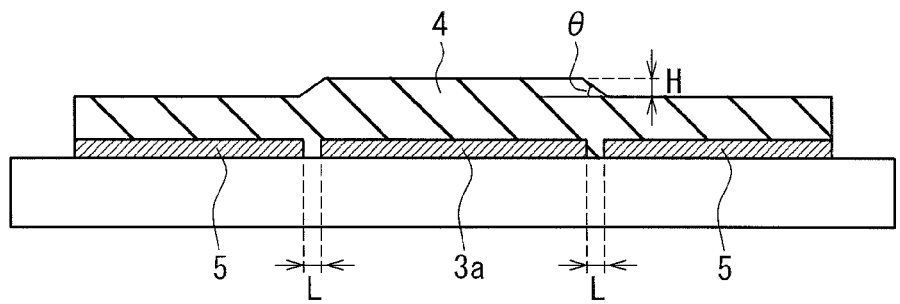
FIG. 14A is an example of a cross-sectional view of an acoustic wave device according to Variation 3.
Figure 14B:
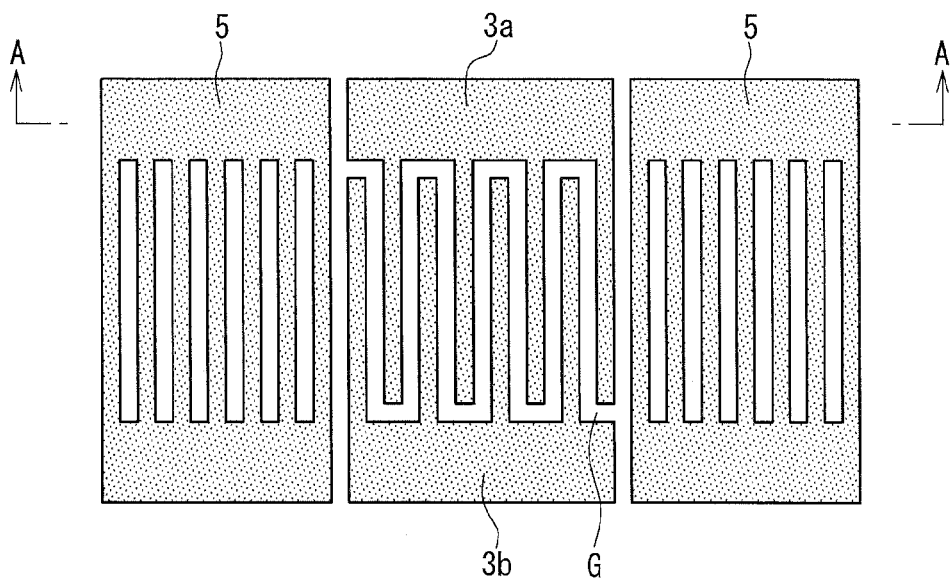
FIG. 14B is an example of a top view of IDT electrodes and reflectors of the acoustic wave device according to Variation 3.
Figure 14C:
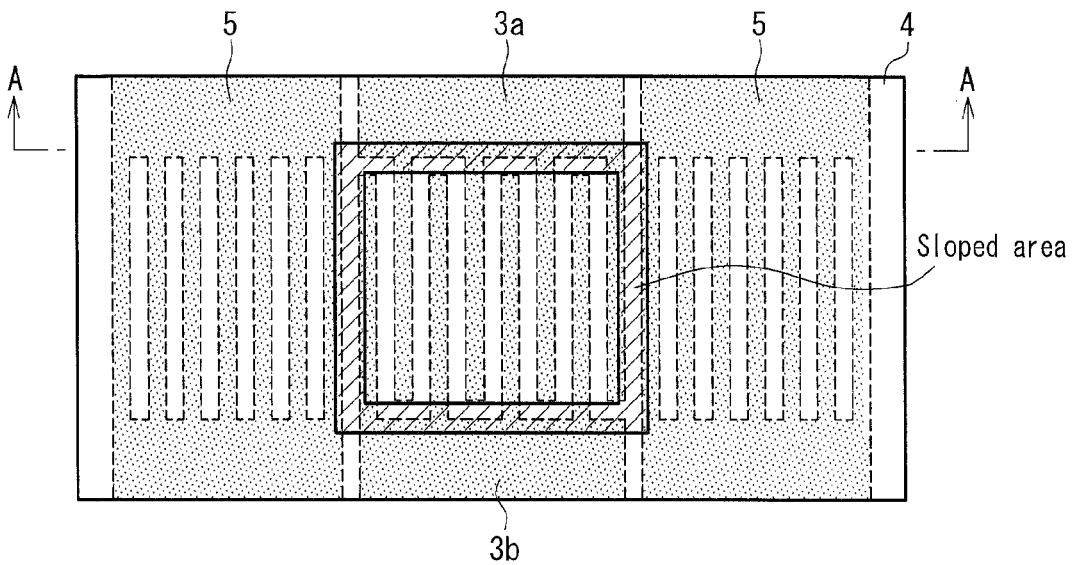
FIG. 14C is an example of a top view of a sloped portion of a dielectric film of the acoustic wave device according to Variation 3.

FIG. 14A is a cross-sectional view of an acoustic wave device according to Variation 3. FIG. 14B is a top view of IDT electrodes 3a and 3b and reflectors 5 of the acoustic wave device according to this variation. FIG. 14C is a top view illustrating a sloped portion of a dielectric film of the acoustic wave device shown in FIG. 14A. The cross-sectional view of FIG. 14A illustrates a cross section taken along line A-A in FIGS. 14B and 14C.

The sloped portion of the dielectric film 4 shown in FIG. 1C is formed extending in the propagation direction of acoustic waves so as to cover gap portions of the IDT electrodes 3a and 3b and further extending to the reflectors 5 on both sides of the IDT electrodes 3a and 3b. In contrast, in the example shown in FIGS. 14A and 14C, the sloped portion of the dielectric film 4 is formed extending in the propagation direction through the gap portions of the IDT electrodes 3a and 3b and is then bent perpendicularly in the electrode finger direction so as to be formed between the reflectors 5 and the IDT electrodes 3a and 3b. Forming the sloped portion of the dielectric film 4 in this way is preferable from the viewpoint of manufacturing efficiency.

Communication Device

A module or Communication device that includes the acoustic wave device or acoustic wave filter described above is also one embodiment of the present invention.

Figure 15:
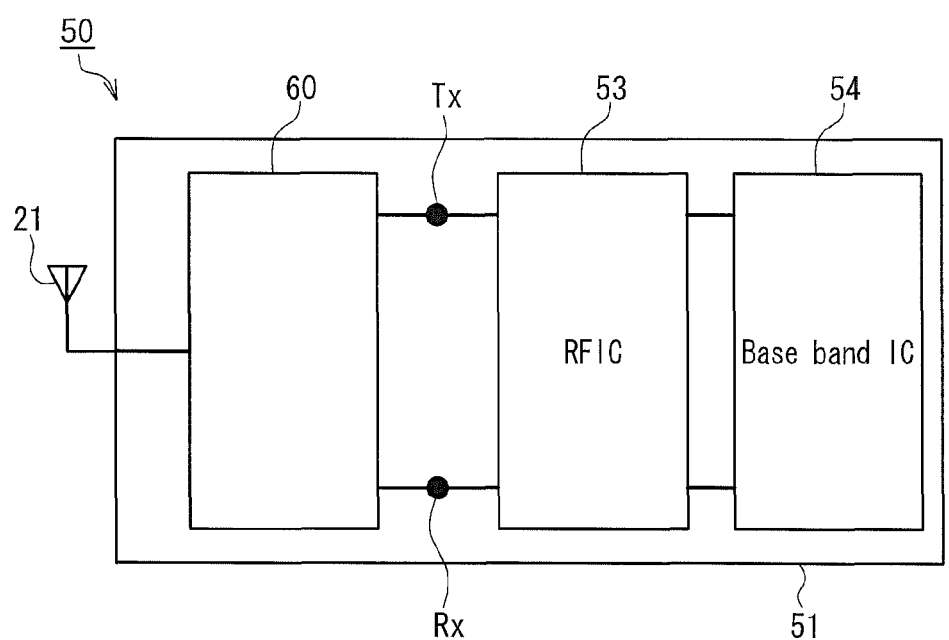
FIG. 15 illustrates an exemplary configuration of Communication device.

FIG. 15 shows an exemplary configuration of such Communication device. In Communication device 50 shown in FIG. 15, a communication module 60, an RFIC 53, and a base band IC 54 are provided on a module substrate 51. The communication module 60 may, for example, include one of the acoustic wave devices described in the above embodiments.

A transmission terminal Tx of the communication module 60 is connected to the RFIC 53, and a receiving terminal Rx thereof is also connected to the RFIC 53. The RFIC 53 is connected to the base band IC 54. The RFIC 53 can be implemented by semiconductor chips and other parts. The RFIC 53 includes an integration of circuits including a receiving circuit for processing received signals inputted from the receiving terminal and a transmission circuit for processing transmission signals.

The base band IC 54 can also be implemented by semiconductor chips and other parts. The base band IC 54 includes an integration of a circuit for converting signals received from the receiving circuit included in the RFIC 53 into audio signals or packet data, and a circuit for converting audio signals or packet data into transmission signals and outputting the signals to the transmission circuit included in the RFIC 53.

Although not shown, the base band IC 54 is connected to, for example, output equipment such as a speaker or a display and is able to output audio signals and packet data that have been converted from received signals by the base band IC 54 and cause a user of the Communication device 50 to recognize these signals and data. The base band IC 54 is also connected to input equipment of the Communication device 50 such as a microphone and buttons and is configured to be able to convert voice and data inputted from a user into transmission signals. Note that the configuration of the Communication device 50 is not limited to the example shown in FIG. 15.

Other Variations

While the above has been a description of embodiments, embodiments of the present invention are not limited to the examples described above. For example, although the above embodiment describes a configuration in which the dielectric film has a slope over the entire gap portions, a configuration is also possible in which the film thickness of the dielectric film changes in at least part of the gap portions. Although the case in which the film thickness of the dielectric film continuously changes so as to form a sloped face has been described, the change in the film thickness of the dielectric film may be intermittent. Also, although the substrate is piezoelectric in the above-described embodiment, the dielectric film or both of the substrate and the dielectric film may be piezoelectric. Furthermore, acoustic wave devices to which the present invention is applied may use any one of surface acoustic waves (SAW), Love waves, Lamb waves, and boundary waves. Although the above-described embodiment shows an example of a single-port acoustic wave resonator in which a pair of IDT electrodes is sandwiched between the reflectors, a plurality of pairs of IDT electrodes may be formed depending on the purpose for which acoustic wave devices are used. It is also possible to omit the reflectors.

According to the above-described embodiments, it is possible in an acoustic wave device to reduce unnecessary vibration in transverse modes. In contrast, for example, in the device disclosed in Patent Document 1 above in which the dielectric film is formed on the piezoelectric substrate, excited acoustic waves are distributed into the dielectric film. The method disclosed in Patent Document 1 thus allows dispersion of only some acoustic waves, and therefore, suppression of spurious responses may be insufficient.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. An acoustic wave device comprising:
a substrate;
a dielectric film formed on the substrate; and
a pair of IDT electrodes opposing each other provided between the substrate and the dielectric film,
wherein at least one of the substrate and the dielectric film is piezoelectric,
wherein the IDT electrodes each include an electrode finger that extends in at least one direction,
wherein the dielectric film has a sloped area in a gap portion that is an area between a tip of the electrode finger of one of the IDT electrodes and the other IDT electrode that is opposing to said one of the IDT electrodes in the direction of extension of the electrode finger, so that a film thickness of the dielectric film changes in said gap, and
wherein a film thickness difference caused by the change in the film thickness of the dielectric film in said sloped area is greater than a thickness of the IDT electrodes.

2. The acoustic wave device according to claim 1, wherein a change in the film thickness of the dielectric film starts outward of one end of the gap portion and ends outward of the other end of the gap portion.

3. The acoustic wave device according to claim 1, wherein the IDT electrodes each include a bus bar and an electrode finger connected to the bus bar, and
the film thickness of the dielectric film on the bus bar is different from the film thickness of the dielectric film on the electrode finger.

4. The acoustic wave device according to claim 1, wherein a film thickness difference H caused by the change in the film thickness of the dielectric film, a slope angle θ formed by the change in the film thickness, and a gap length L of the gap portion in the direction of extension of the electrode fingers have a relationship that satisfies the following formula (1):

$$\theta \le \tan^{-1}(H/L) \qquad (1).$$

5. The acoustic wave device according to claim 1, wherein in the IDT electrodes, a plurality of electrode fingers are alternately disposed in a propagation direction of acoustic waves and a length over which the plurality of electrode fingers alternate is constant in the propagation direction.

6. Communication device provided with the acoustic wave device according to claim 1.

7. The acoustic wave device according to claim 1, wherein the IDT electrodes have an alternate area where a plurality of said electrode fingers are disposed alternately, and said sloped area of the dielectric film that changes the film thickness is provided also in a dummy portion which is not the alternate area of the electrode fingers.

* * * * *